(12) United States Patent
Ma

(10) Patent No.: US 10,032,837 B2
(45) Date of Patent: Jul. 24, 2018

(54) ORGANIC ELECTROLUMINESCENT DISPLAY DEVICE WITH ENHANCED EXTRACTION EFFICIENCY

(71) Applicant: Japan Display Inc., Minato-ku (JP)

(72) Inventor: Chunche Ma, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/683,955

(22) Filed: Aug. 23, 2017

(65) Prior Publication Data

US 2018/0069062 A1 Mar. 8, 2018

(30) Foreign Application Priority Data

Sep. 5, 2016 (JP) ................................ 2016-173039

(51) Int. Cl.
| | |
|---|---|
| *H05B 33/00* | (2006.01) |
| *H05B 33/14* | (2006.01) |
| *H01L 27/32* | (2006.01) |
| *H01L 51/52* | (2006.01) |

(52) U.S. Cl.
CPC ...... *H01L 27/3246* (2013.01); *H01L 51/5271* (2013.01); *H01L 51/5275* (2013.01)

(58) Field of Classification Search
CPC ............. H01L 27/3246; H01L 51/5271; H01L 51/5275; H01L 27/14609; H01L 2251/53; G02B 5/0226; G09G 3/3225
See application file for complete search history.

(56) References Cited

U.S. PATENT DOCUMENTS

| | | | | |
|---|---|---|---|---|
| 9,716,242 | B2* | 7/2017 | Kim | .................... G02B 5/02 |
| 9,825,106 | B2* | 11/2017 | Li | .................... H01L 27/3246 |
| 2004/0183436 | A1 | 9/2004 | Ito et al. | |
| 2005/0129841 | A1* | 6/2005 | McCormick | ........ H01L 51/0008 427/66 |

FOREIGN PATENT DOCUMENTS

JP    2004-288447    10/2004

* cited by examiner

*Primary Examiner* — Tracie Y Green
(74) *Attorney, Agent, or Firm* — Oblon, McClelland, Maier & Neustadt, L.L.P.

(57) ABSTRACT

An organic electroluminescent display device for improving light extraction efficiency is provided. A bank has an opening part at a position of a light-emitting surface of OLED. A sealing film is formed along an inside surface of the opening part, which is formed by a bottom surface where the light-emitting surface exists and a sidewall part of the bank rising from the bottom. A light-transmitting film is laminated on the sealing film and covers the opening part. The sidewall part of the bank includes a first sidewall part and a second sidewall part which is higher than the first sidewall part in height from the substrate. An inclination of the second sidewall part is greater than that of the first sidewall part, and a refractive index of the light-transmitting film is smaller than a refractive index of the sealing film in contact with the light-transmitting film.

6 Claims, 5 Drawing Sheets

ORGANIC ELECTROLUMINESCENT DISPLAY DEVICE WITH ENHANCED EXTRACTION EFFICIENCY

CROSS-REFERENCE TO RELATED APPLICATION

The present application claims priority from Japanese application JP2016-173039 filed on Sep. 5, 2016, the content of which is hereby incorporated by reference into this application.

BACKGROUND OF THE INVENTION

1. Field of the Invention

The present invention relates to an organic electroluminescent display device in which a plurality of pixels respectively include organic light emitting elements and banks are formed between the pixels.

2. Description of the Related Art

The organic electroluminescent (EL) display device has a structure including, for example, an array substrate formed of glass or a resin film, on which a pixel circuit, an organic light-emitting diode (OLED), and a sealing film are laminated. A display surface protecting film is adhered to the sealing film using an adhesive agent, for example.

An OLED is formed for each pixel, and a bank is formed at a boundary between adjacent pixels as a partition. The OLED includes a lower electrode, an organic layer, and an upper electrode. The lower electrode and the upper electrode respectively form an anode electrode (positive electrode) and a cathode electrode (negative electrode) of the OLED. The upper electrode is formed to be shared with pixels in an overall display area, and applied with a common voltage from a driving unit. The lower electrode is formed for each of the pixels. A bank is formed of an insulating layer between adjacent pixels, and electrically isolates the lower electrodes from each other.

SUMMARY OF THE INVENTION

The sealing film is laminated on the OLED. The sealing film is resistant to moisture, and protects the OLED from moisture coming from the adhesive agent thereon, for example, thereby preventing the OLED from being deteriorated. The sealing film is formed of silicon nitride, for example.

Similarly to other display devices, an organic EL display device seeks to improve definition of a display image. A pixel area is reduced as the definition is increased, and a light-emitting area of the OLED is also reduced. As such, it is required to increase light extraction efficiency from the OLED in each pixel.

The OLED emits light not only in a normal direction of a display surface of the display device, but also in a direction shifted from the normal direction, that is, an oblique direction. Sometimes the light emitted from the OLED in the oblique direction is not able to be extracted on the display surface side, and the light extraction efficiency of the display device is not sufficient. More specifically, sometimes the obliquely emitted light can be incident on the bank, and the light incident on the bank is reflected off an interface between the bank and a layer on the bank and does not exit from the bank to the display surface side.

One or more embodiments of the present invention have been conceived in view of the above, and an object thereof is to provide a display device with enhanced light extraction efficiency.

(1) An organic electroluminescent display device according to an embodiment of the present invention includes an organic light emitting element on a substrate for a pixel, a bank along a boundary of the pixel and having an opening part at a position of a light-emitting surface of the organic light emitting element, a sealing film along an inside surface of the opening part, which is formed by a bottom surface where the light-emitting surface exists and a sidewall part of the bank rising from the bottom, and a light-transmitting film on the sealing film and covers the opening part. The sidewall part of the bank includes a first sidewall part and a second sidewall part, an inclination of the first sidewall part to a surface of the substrate being a first angle, the second sidewall part being higher than the first sidewall part in height from the substrate, an inclination of the second sidewall part to the surface of the substrate being a second angle. The second angle is greater than the first angle. A refractive index of the light-transmitting film is smaller than a refractive index of the sealing film in contact with the light-transmitting film.

(2) The organic electroluminescent display device according to another embodiment of the present invention includes an organic light emitting element on a substrate for a pixel, a bank along a boundary of the pixel and having an opening part at a position of a light-emitting surface of the organic light emitting element, a sealing film along an inside surface of the opening part, which is formed by a bottom surface where the light-emitting surface exists and a sidewall part of the bank rising from the bottom, and a light-transmitting film on the sealing film and covers the opening part. An inclination angle of the sidewall part of the bank to a surface of the substrate is larger at an upper edge of the sidewall part than at a lower edge of the sidewall part, and monotonically increases from the lower edge to the upper edge. A refractive index of the light-transmitting film is smaller than a refractive index of the sealing film in contact with the light-transmitting film.

DETAILED DESCRIPTION OF THE INVENTION

An embodiment of the present invention will be described below in detail with reference to the accompanying drawings. The disclosure herein is merely an example, and appropriate modifications coming within the spirit of the present invention, which are easily conceived by those skilled in the art, are intended to be included within the scope of the invention as a matter of course. The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Further, in the detailed description of the invention, when a positional relationship between a component and another component is defined, if not otherwise stated, the words "on" and "below" suggest not only a case where the another component is disposed immediately on or below the component, but also a case where the component is disposed on or below the another component with a third component interposed therebetween.

Figure 1:
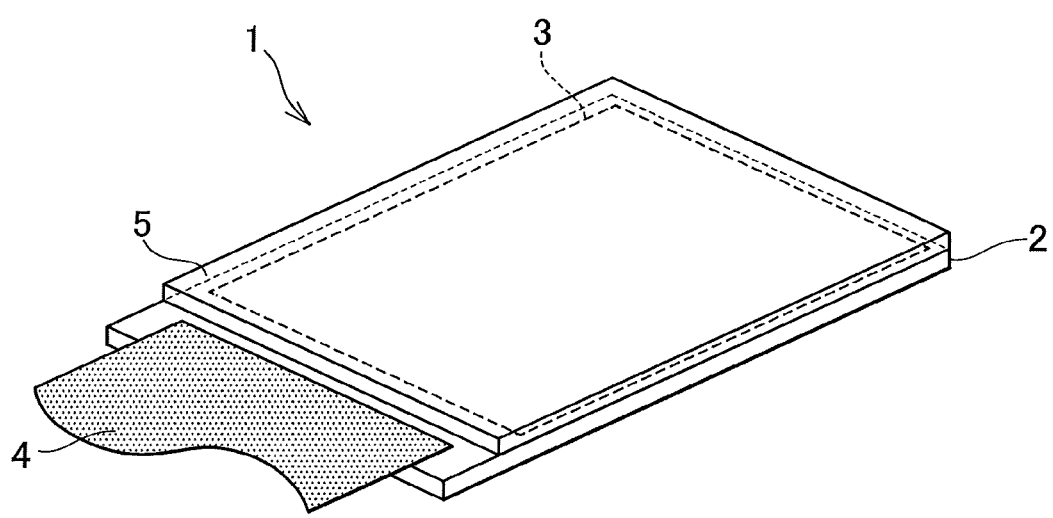
FIG. 1 is a schematic perspective view of an organic EL display device according to an embodiment of the present invention.

FIG. 1 is a schematic perspective view of an organic EL display device 1 according to the embodiment of the present invention. The organic EL display device 1 includes an array substrate 2 made of glass or a flexible material, on which a display area 3 having a plurality of pixels is disposed. A drive circuit (not shown) for controlling the pixels may be formed on the array substrate 2. Signals and power for controlling the pixels are supplied through a flexible print circuit (FPC) 4. The FPC 4 is electrically connected to terminals (not shown) formed on the array substrate 2. A display surface protecting film 5 or a counter substrate maybe provided in order to protect the display area 3.

Figure 2:
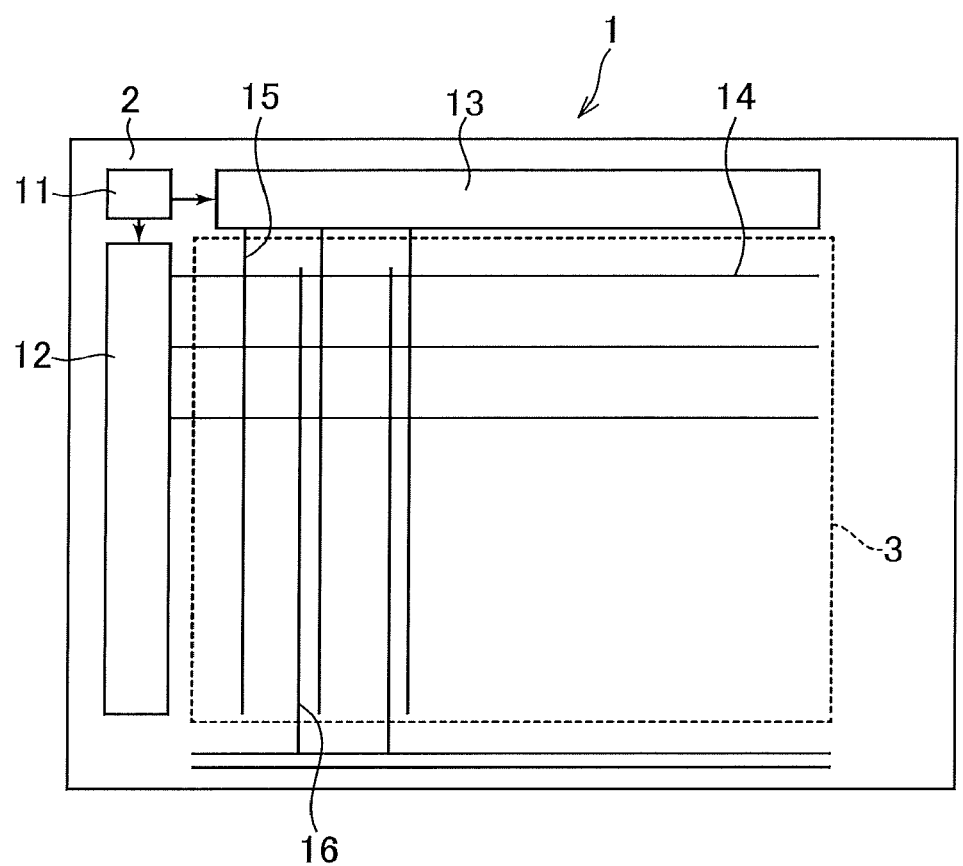
FIG. 2 is a schematic plan view illustrating an overall configuration of the organic EL display device according to the embodiment of the present invention.
Figure 3:
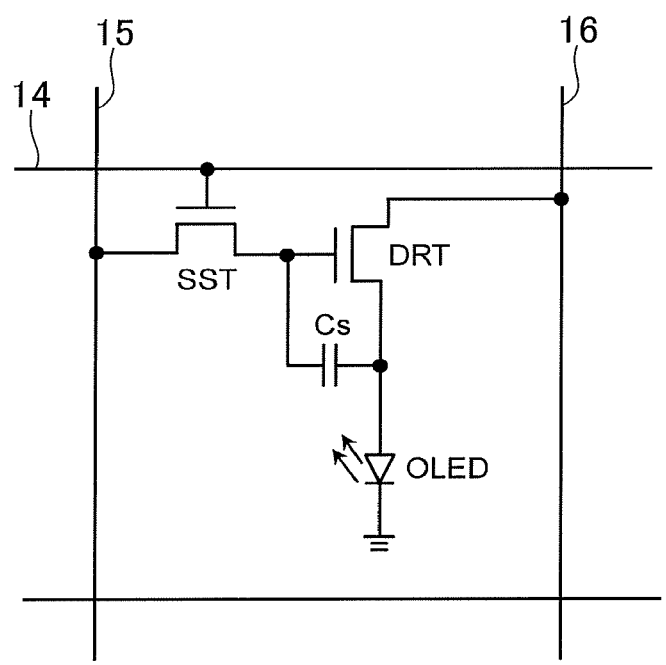
FIG. 3 is a diagram illustrating a circuit configuration of each pixel of the organic EL display device according to the embodiment of the present invention.

FIG. 2 is a schematic plan view illustrating an overall configuration of the organic EL display device 1 according to the embodiment of the present invention. FIG. 3 is a diagram illustrating a circuit configuration of each pixel of the organic EL display device 1 according to the embodiment of the present invention. The organic EL display device 1 uses a control unit 11, a scanning line driving circuit 12, and a video line driving circuit 13 to control illumination of the OLEDs respectively provided in the pixels disposed on the display area 3 of the array substrate 2 in a matrix, thereby displaying an image.

The scanning line driving circuit 12 is connected to a scan signal line 14 provided for each line of pixels in a horizontal direction (each pixel row). The video line driving circuit 13 is connected to a video signal line 15 provided for each line of pixels in a vertical direction (each pixel column).

A circuit of each pixel includes a pixel transistor SST, a drive transistor DRT, and a storage capacitor Cs, and is connected to the scan signal line 14 and the video signal line 15. In response to signals supplied from the signal lines, illumination of the OLEDs of the respective pixels is controlled. The pixel transistor SST and the drive transistor DRT are thin film transistors (TFT) formed on the array substrate 2.

A gate of each pixel transistor SST is electrically connected to the scan signal line 14. A scan signal line 14 of a pixel row is common to gates of pixel transistors SST arranged in such a pixel row. One of the source and the drain of the pixel transistor SST is electrically connected to the video signal line 15, and the other is electrically connected to the gate of the drive transistor DRT. A video signal line 15 of a pixel column is common to pixel transistors SST arranged in such a pixel column. The drive transistor DRT is, for example, an n-channel field effect transistor, and a source thereof is electrically connected to an anode of the OLED, and a drain thereof is electrically connected to the power source line 16. The cathode of the OLED is fixed to a ground potential or a negative potential, and the power source line 16 is provided with a potential to cause a positive voltage between the cathode potential of the OLED and the power source line 16.

The scanning line driving circuit 12 selects scan signal lines 14 in a sequential order in response to timing signals from the control unit 11, and applies voltage for turning on the pixel transistor SST to the selected scan signal line 14.

The video line driving circuit 13 receives a video signal from the control unit 11, and, in response to the scan signal line 14 selected by the scanning line driving circuit 12, outputs a voltage corresponding to the video signal of the selected pixel row to each video signal line 15. The voltage is written into the storage capacitor Cs through the pixel transistor SST in the selected pixel row. The drive transistor DRT supplies electric current according to the written voltage to the OLEDs, which causes the OLED of the pixel corresponding to the selected scan signal line 14 to emit light.

Here, the pixel transistor SST and the drive transistor DRT are disclosed as transistors forming pixels, although a transistor having other functions may be included.

In FIG. 2, the scanning line driving circuit 12 and the video line driving circuit 13 are illustrated as different blocks, but may be included in an integrated circuit (IC), or formed separately in three or more different positions. In the case where the scanning line driving circuit 12 and the video line driving circuit 13 are incorporated in the IC, the circuits may be mounted on the array substrate 2, or on the FPC shown in FIG. 1.

Figure 4:
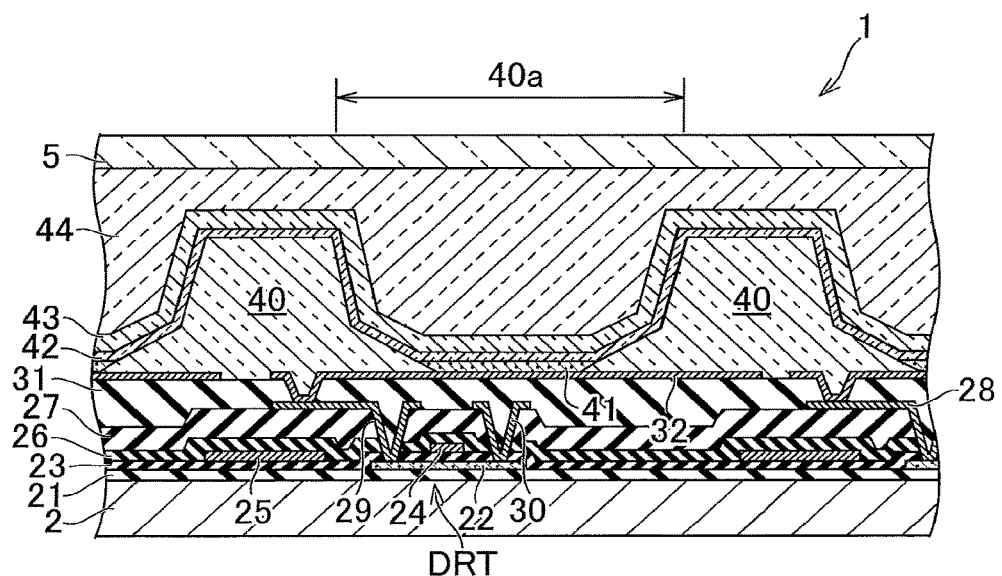
FIG. 4 is a schematic partial sectional view illustrating a vertical sectional structure of a pixel of the organic EL display device 1 according to the embodiment of the present invention.

FIG. 4 is a schematic partial sectional view illustrating a vertical sectional structure of a pixel of the organic EL display device 1 according to the embodiment of the present invention.

The array substrate 2 is made of resin or glass. The array substrate 2 may be formed of a flexible film, such as polyimide and polyethylene terephthalate. An undercoat layer 21 is formed on the array substrate 2 in order to serve as a barrier to impurities contained in the array substrate 2. The undercoat layer 21 is made of a silicon oxide film or a silicon nitride film, for example, or may be a lamination structure of these films.

A semiconductor layer 22 is laminated on the undercoat layer 21, and a channel region, a source region, and a drain region of a TFT of the pixel circuit are formed by the semiconductor layer 22. The semiconductor layer 22 shown in FIG. 4 corresponds to the channel region, the source region, and the drain region of the drive transistor DRT. After the semiconductor layer 22 is formed, a gate insulating film 23 is formed of silicone oxide, for example, and a metal layer laminated on the gate insulating film 23 is patterned to form a gate electrode 24 and wiring 25 of the TFT.

For example, a silicon nitride film 26 and a silicone oxide film 27 are sequentially laminated on the gate electrode 24 as an insulating interlayer. A wiring layer 28 made of metal is formed on the insulating interlayer, and a source electrode 29 and a drain electrode 30 of the TFT are formed by using the wiring layer 28. The source electrode 29 and the drain electrode 30 are electrically connected to the semiconductor layer 22 of the TFT through contact holes penetrating through the gate insulating film 23, the silicon nitride film 26, and the silicone oxide film 27.

A flattening film 31 is disposed so as to cover the silicone oxide film 27 and the wiring layer 28. The flattening film 31 is formed of an insulating material, and the lower electrode 32 of the OLED is formed on an insulating surface of the flattening film 31. An organic material, such as photosensitive acrylic resin, is often used for the flattening film 31. For example, the lower electrode 32 corresponds to an anode of the OLED shown in FIG. 3, and is a plurality of pixel electrodes configured to respectively correspond to unit pixels (sub-pixels). Basically, the flattening film 31 is formed to have a flat surface on which the lower electrode 32 is provided.

The lower electrode 32 is electrically connected to the source electrode 29 of the drive transistor DRT through a contact hole penetrating through the flattening film 31.

A bank 40 made of an insulating material is formed on the flattening film 31 and the lower electrode 32. The bank 40 is formed along the boundary of the pixels, and has an opening part 40a at a light-emitting surface of the OLED. Specifically, the bank 40 covers the edge part of the lower electrode 32, and has the opening part 40a by which a part (e.g., center part) of the lower electrode 32 is exposed. At the bottom of the opening part 40a of the bank 40, an organic layer 41 including a light-emitting layer is formed. The organic layer 41 is formed so as to cover the bottom of the opening part 40a. Here, the organic layer 41 is formed only to cover the bottom of the opening part 40a, although the organic layer 41 may extend to a sidewall part of the opening part 40a or a part of the upper surface of the bank 40 unless the organic layer 41 reaches an opening part 40a of an adjacent pixel.

An upper electrode 42 of the OLED is formed along an inside surface of the opening part 40a of the bank 40. Specifically, the upper electrode 42 is deposited on the upper surface of the organic layer 41 at the bottom of the opening part 40a, and deposited on the sidewall part of the bank 40 at the side of the opening part 40a. The upper electrode 42 corresponds to the cathode of the OLED shown in FIG. 3. The upper electrode 42 may serve as a common electrode extending across the all pixels in the display area 3. Specifically, the upper electrode 42 is formed as a film continuously extending over the inside surface of the opening part 40a and the upper surface of the bank 40. The upper electrode 42 is made of a material that transmits light from the organic layer 41. For example, the upper electrode 42 is made of a transparent conductive material, such as indium tin oxide (ITO) and indium zinc oxide (IZO). Alternatively, the upper electrode 42 may be formed of a metal layer made of magnesium, silver, or an alloy thereof in such a thickness that transmits light, more specifically, in several nm to several tens of nm thickness.

A sealing film 43 is formed on the display area 3, on which the OLED including the lower electrode 32, the organic layer 41, and the upper electrode 42 is formed, to protect the OLED from moisture. The sealing film 43 is formed along the inside surface of the opening part 40a, which is formed by the bottom of the OLED, that is, the light-emitting surface of the OLED, and the sidewall part of the bank 40 rising from the bottom. In this embodiment, the sealing film 43 also covers the upper surface of the bank 40. In this embodiment, the upper electrode 42 serving as a common electrode is basically formed across the entire display area 3, and the sealing film 43 is laminated on the upper electrode 42.

A display surface protective film 5 or a counter substrate is adhered to the sealing film 43 through a transparent light-transmitting film 44 made of an adhesive agent, for example. The light-transmitting film 44 covers the opening part 40a. In addition, in this embodiment, the light-transmitting film 44 is formed over a pixel boundary area where the bank 40 is formed, and basically formed continuously over the entire display area 3.

Figure 5:
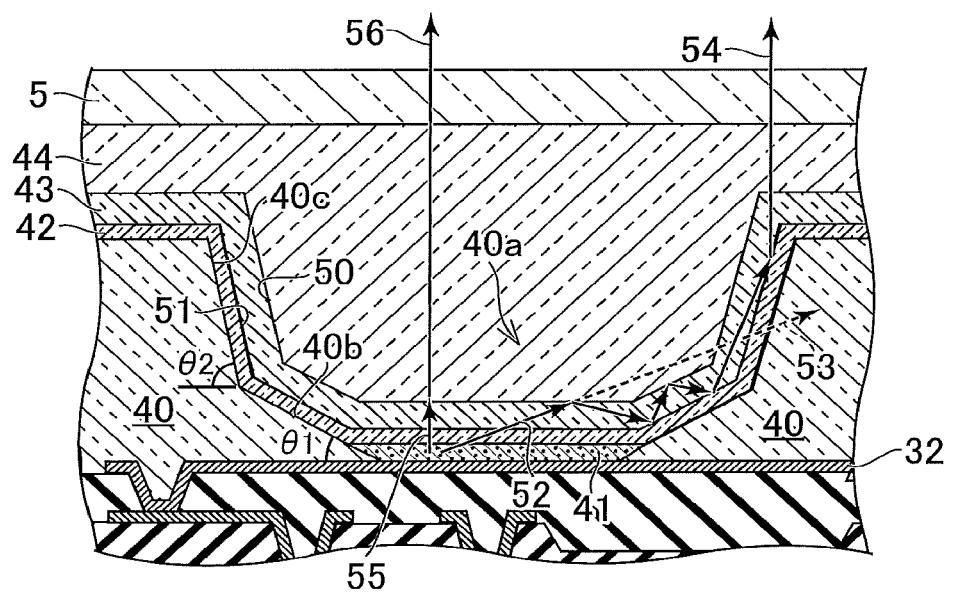
FIG. 5 is a schematic vertical sectional view of a structure above the OLED in an opening part.

FIG. 5 is a schematic vertical sectional view of a structure above the OLED in an opening part 40a. Referring to FIG. 5, emission of light from the OLED will be described.

FIG. 5 schematically illustrates light from the organic layer 41 of the OLED by arrows. The direction of light from the OLED is not necessarily perpendicular to the light-emitting surface of the OLED, but can be oblique to the perpendicular direction. As such, the light may enter the side surface of the opening part 40a. For this reason, as described in JP2004-288447A, the side surface of the opening part 40a is provided with a function to reflect light using total reflection at a medium boundary when light enters from a medium with a higher refractive index to a medium with lower refractive index. For example, a layer with a higher refractive index than that of the bank is provided on the sidewall part of the bank so that total reflection can occur. This configuration prevents the light that has reached the side surface of the opening part 40a from entering the bank, and improves the light extraction efficiency from the display surface.

In this embodiment, it is configured such that $n_B < n_E < n_S$ is achieved where $n_B$ is a refractive index of the bank 40, $n_E$ is a refractive index of the upper electrode 42, and $n_S$ is a refractive index of the sealing film 43. With this configuration, the total reflection of the incident light from the OLED to the side surface of the opening part 40a can occur. Specifically, the bank 40 is made of materials such as polyimide resin, epoxy resin, acrylic resin, methacrylic resin, and silicon resin. The refractive index of visible light of many of the materials used for the bank 40 is less than 1.9, and about 1.5 to 1.6 most of the time. On the other hand, the refractive index of ITO and IZO used for the upper electrode 42 varies depending on the composition, forming method, and crystal structure of the upper electrode 42, although the refractive index of the ITO is about 1.7 to 2.3, and the refractive index of the IZO is about 1.9 to 2.4, and each have high refractive index. The sealing film 43 is made of silicon nitride (SiN) or silicon oxinitride (SiON), both of which have the refractive index of about 2.0. As such, it is possible to select materials so as to achieve the configuration of $n_B < n_E < n_S$.

However, even if the side surface of the opening part 40a has reflecting function, light having an angle of incidence with the side surface less than a critical angle does not reflect but leaks into the bank 40. The present invention reduces the leakage of light into the bank 40, which can occur even if the side surface of the opening part 40a has reflecting function, and further improves light extraction efficiency from the display surface. In the following, features of the present invention in this embodiment will be described.

One of the features of the present invention is that the light-transmitting film 44 laminated on the surface of the sealing film 43 is made of a material having a refractive index smaller than that of the sealing film 43. With this configuration, a boundary surface is formed between the sealing film 43 and the light-transmitting film 44. On the boundary surface, total reflection of light from the sealing film 43 to the light-transmitting film 44 can occur. In the following, this boundary surface will be referred to as an upper reflective surface 50. As described above, a boundary surface, on which total reflection can occur, is also provided on the upper electrode 42 side of the sealing film 43. This boundary surface will be referred to as a lower reflective surface 51. That is, the sealing film 43 functions as an optical waveguide, and enables the light, which is obliquely entered from the OLED to the sealing film 43 at the bottom of the opening part 40a, to proceed to the side surface of the opening part 40a from the bottom, and further proceed upward along the side surface of the opening part 40a to exit from the display surface. For example, when a beam 52 shown in FIG. 5 travels straight, the beam 52 enters the lower reflective surface 51 at the side surface of the opening part 40a at less than the critical angle, and can be leaking light 53 into the bank 40. In this embodiment, the beam 52 is reflected on the upper reflective surface 50 and the lower reflective surface 51, and can be light 54 emitted from the display surface.

The light-transmitting film 44 is made of an organic resin material, such as polyimide resin, epoxy resin, acrylic resin, methacrylic resin, and silicon resin. Similarly to the beam 55 shown in FIG. 5, a component of the light entering from the OLED to the sealing film 43 and having an angle of incidence with the upper reflective surface less than the critical angle can be light 56 that enters the light-transmitting film 44, passes through the light-transmitting film 44, and exits from the display surface.

Another feature of the present invention is that inclination of the sidewall part of the bank 40 is gradually increased from the lower edge to the upper edge of the bank 40. Here, the surface of the array substrate 2 is defined as a horizontal plane, and inclination of the surface of the lamination structure on the array substrate 2 is defined according to an angle to the horizontal plane.

The optical waveguide formed of the sealing film 43 is prone to cause leakage of light at a portion having a large curvature similarly to bending loss of optical fiber. In order to micro-miniaturize a pixel without narrowing the light-emitting surface of the OLED, that is, the bottom of the opening part 40a, it is necessary to increase the inclination of the sidewall part of the bank 40 so as to prevent the upper edge opening of the opening part 40a from widening. As such, a difference of orientations of the lower reflective surface can be relatively large between the bottom of the opening part 40a, which is basically horizontal, and the upper edge having large inclination. However, in the present invention, changes in the orientations of the lower reflective surface are distributed between the bottom and the upper edge of the opening part 40a, and thus the leakage of light into the bank 40 can be reduced.

The sidewall part of the bank 40 of this embodiment includes a first sidewall part 40b and a second sidewall part 40c. An angle of the first sidewall part 40b to the horizontal plane, that is, an inclination of the first sidewall part 40b, is a first angle $\theta_1$. The second sidewall part 40c is located higher than the first sidewall part 40b, and an inclination of the second sidewall part 40c is a second angle $\theta_2$, which is greater than $\theta_1$. For example, the first sidewall part 40b and the second sidewall part 40c are continuously positioned in a height direction. For example, $\theta_1$ is equal to or less than 30 degrees, and $\theta_2$ is equal to or greater than 65 degrees and less than 90 degrees. In the organic EL display device 1, a height is measured in the upward direction in FIGS. 4 and 5, that is, in a direction from the array substrate 2 to the display surface protective film 5 or the counter substrate.

For example, the bank 40 is able to be formed by sequentially laminating a first bank layer having the first sidewall part 40b and a second bank layer having the second sidewall part 40c. For example, the first bank layer is formed by photolithography technique by coating photosensitive resin on the display area 3 on which the lower electrode 32 is formed. Subsequently, the second bank layer is formed by photolithography technique by again coating photosensitive resin on the first bank layer. The inclined side surface of the first sidewall part 40b can be formed by performing inclined exposure process when a part of the photosensitive resin film where the first bank layer is formed is selectively exposed and cured using an exposure mask. The second sidewall part 40c can also be formed in the same manner.

The first bank layer and the second bank layer maybe formed of different materials. Further, the bank 40 has three or more sidewall parts that have different inclinations. When m sidewall parts (m is a natural number of 3 or more) forming the bank 40 are described as sidewall parts k (k is a natural number where 1≤k≤m) from the lower side, and an inclination angle of the sidewall part k is $\theta_k$, a relationship $\theta_k<\theta_{k+1}$ is satisfied, where k denotes an arbitrary natural number equal to or smaller than m−1.

In general, the sidewall part is shaped such that the sidewall part has an inclination angle that is greater at the upper edge of the sidewall part than the lower edge of the sidewall part, and monotonically increases from the lower edge of the sidewall part to the upper edge of the sidewall part. For example, the sidewall part of the bank 40 may include a part where the inclination angle continuously changes. In this regard, monotonically increasing includes a case where values do not change. Here, under the condition that the inclination angle is greater at the upper edge of the sidewall part than at the lower edge of the sidewall part, the case where the inclination angle does not change from the lower edge to the upper edge is excluded. On the other hand, the case where the inclination angle does not change at a part of the sidewall part from the lower edge to the upper edge is included. In this general case as well, the inclination angle of the sidewall part of the bank 40 at the lower edge may be defined as 30 degrees or less.

In the embodiment described above, the light-transmitting film 44 having a low refractive index laminated on the surface of the sealing film 43 is a layer for adhering the display surface protective film 5, although the light-transmitting film 44 is not necessarily a layer for adhesion purposes. For example, the light-transmitting film 44 having the low refractive index may be formed between the sealing film 43 and a layer made of an adhesive agent.

The present invention is not limited to the above described embodiment and may be modified in various manners. For example, the configuration described in the embodiment may be replaced by any configurations that have substantially the same configuration as the configuration in the embodiment described above, provide the same effects as those of the embodiment described above, or achieve the same objective as that of the embodiment described above. While there have been described what are at present considered to be certain embodiments of the invention, it will be understood that various modifications maybe made thereto, and it is intended that the appended claims cover all such modifications as fall within the true spirit and scope of the invention.

What is claimed is:

1. An organic electroluminescent display device comprising:
   an organic light emitting element on a substrate for a pixel;
   a bank along a boundary of the pixel and having an opening part at a position of a light-emitting surface of the organic light emitting element;
   a sealing film along an inside surface of the opening part, which is formed by a bottom surface where the light-emitting surface exists and a sidewall part of the bank rising from the bottom; and a light-transmitting film on the sealing film and covers the opening part, wherein the sidewall part of the bank includes a first sidewall part and a second sidewall part, an inclination of the first sidewall part to a surface of the substrate being a first angle, the second sidewall part being higher than the first sidewall part in height from the substrate, an inclination of the second sidewall part to the surface of the substrate being a second angle, the second angle is greater than the first angle, and a refractive index of the light-transmitting film is smaller than a refractive index of the sealing film in contact with the light-transmitting film.

2. The organic electroluminescent display device according to claim 1, wherein the first angle is equal to or less than 30 degrees, and the second angle is equal to or more than 65 degrees and less than 90 degrees.

3. The organic electroluminescent display device according to claim 1, wherein the light-transmitting film includes an organic resin material, and the sealing film in contact with the light-transmitting film includes silicon nitride or silicon oxinitride.

4. An organic electroluminescent display device comprising:

an organic light emitting element on a substrate for a pixel;

a bank along a boundary of the pixel and having an opening part at a position of a light-emitting surface of the organic light emitting element;

a sealing film along an inside surface of the opening part, which is formed by a bottom surface where the light-emitting surface exists and a sidewall part of the bank rising from the bottom; and a light-transmitting film on the sealing film and covers the opening part, wherein an inclination angle of the sidewall part of the bank to a surface of the substrate is larger at an upper edge of the sidewall part than at a lower edge of the sidewall part, and monotonically increases from the lower edge to the upper edge, and a refractive index of the light-transmitting film is smaller than a refractive index of the sealing film in contact with the light-transmitting film.

5. The organic electroluminescent display device according to claim 4, wherein the inclination angle of the sidewall part of the bank at the lower edge is equal to or less than 30 degrees.

6. The organic electroluminescent display device according to claim 4, wherein the light-transmitting film includes an organic resin material, and the sealing film in contact with the light-transmitting film includes silicon nitride or silicon oxinitride.

* * * * *